(12) United States Patent
Liu et al.

(10) Patent No.: US 9,610,717 B2
(45) Date of Patent: Apr. 4, 2017

(54) COMPOSITE OF RESIN AND OTHER MATERIALS AND METHOD FOR MANUFACTURING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Shyan-Juh Liu, New Taipei (TW); Kar-Wai Hon, New Taipei (TW); Sha-Sha Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 77 days.

(21) Appl. No.: 14/513,591

(22) Filed: Oct. 14, 2014

(65) Prior Publication Data

US 2015/0111002 A1 Apr. 23, 2015

(30) Foreign Application Priority Data

Oct. 18, 2013 (CN) .......................... 2013 1 0493062

(51) Int. Cl.
*B29D 11/00* (2006.01)
*B29C 45/14* (2006.01)
(Continued)

(52) U.S. Cl.
CPC .... *B29C 45/14311* (2013.01); *B29C 37/0082* (2013.01); *B29C 59/14* (2013.01);
(Continued)

(58) Field of Classification Search
CPC .......... H01L 31/022425; H01L 31/068; H01L 31/022433; H01L 31/008; B29C 45/14344;
(Continued)

(56) References Cited

U.S. PATENT DOCUMENTS 7,171,676 B2 * 1/2007 Takeda .................. B29C 43/021
204/192.34
8,981,557 B2 * 3/2015 Tu .......................... B82Y 10/00
257/624

(Continued)

FOREIGN PATENT DOCUMENTS

CN 102371649 A 3/2012
CN 102442028 A 5/2012
TW 201205642 A1 2/2012

*Primary Examiner* — Lan Vinh
(74) *Attorney, Agent, or Firm* — Steven M. Reiss

(57) ABSTRACT

A method for manufacturing composite of resin and other materials includes the following steps. A shaped piece made by materials different with resin is provided, and is degreased and cleaned. A resist layer with a lot of location holes is formed on the surface of the heterogeneous member by nano-imprint lithography, and a lot of small holes are formed on the surface of the heterogeneous member while the resist layer is removed. Then the heterogeneous member is inserted in an injection mold, and molten crystalline thermoplastic resin is injected into the mold, thus the resin embedded into the holes and bonding with the shaped piece. The method is environmentally friendly and suitable for mass production.

9 Claims, 3 Drawing Sheets

(51) Int. Cl.
*B32B 3/30* (2006.01)
*B32B 7/08* (2006.01)
*B32B 7/04* (2006.01)
*B29C 59/14* (2006.01)
*B29C 37/00* (2006.01)
*G03F 7/00* (2006.01)
*B32B 15/088* (2006.01)
*B32B 15/09* (2006.01)
*B32B 27/16* (2006.01)
*B32B 27/20* (2006.01)
*B29K 101/12* (2006.01)

(52) U.S. Cl.
CPC ............... *B32B 3/30* (2013.01); *B32B 7/045* (2013.01); *B32B 7/08* (2013.01); *B32B 15/088* (2013.01); *B32B 15/09* (2013.01); *B32B 27/16* (2013.01); *B32B 27/20* (2013.01); *G03F 7/0002* (2013.01); *B29C 2045/14868* (2013.01); *B29C 2045/14885* (2013.01); *B29K 2101/12* (2013.01); *B32B 2250/02* (2013.01); *B32B 2262/101* (2013.01); *B32B 2398/20* (2013.01); *B32B 2509/00* (2013.01); *B32B 2605/08* (2013.01); *Y10T 428/24521* (2015.01)

(58) Field of Classification Search
CPC .. B29C 2045/14352; B29C 2045/1436; B29C 2045/14885; B29C 2045/14868; B29C 45/14311
USPC ...... 438/22, 98, 542, 597, 706, 714; 216/11, 216/24, 41
See application file for complete search history.

(56) References Cited

U.S. PATENT DOCUMENTS

| | | | |
|---|---|---|---|
| 2002/0082543 A1* | 6/2002 | Park | A61B 5/1411 604/21 |
| 2005/0167868 A1 | 8/2005 | Takeda et al. | |
| 2011/0123711 A1* | 5/2011 | Yoon | B81C 99/009 427/135 |
| 2012/0196089 A1* | 8/2012 | Yang | B81C 1/00031 428/156 |
| 2012/0244245 A1* | 9/2012 | Zhu | B82Y 10/00 425/470 |

* cited by examiner

COMPOSITE OF RESIN AND OTHER MATERIALS AND METHOD FOR MANUFACTURING THE SAME

FIELD

This disclosure relates a composite of resin and other materials and a method for manufacturing the same.

BACKGROUND

Composite of resin and other materials are used in a wide range of industrial fields including the production of parts for automobiles, domestic electric appliances, industrial machinery, and the like, and a large number of adhesives have been developed therefor. Among them, excellent adhesives have been developed. For example, adhesives demonstrating adhesive functions at normal temperature or under heating are used for integrally joining resin and other materials, and such a method is presently a generally employed joining technology.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

This disclosure is illustrated by way of example and not by way of limitation in the figures of the accompanying drawings in which like reference numbers indicate similar elements. It should be noted that references to "an" or "one" embodiment in this disclosure are not necessarily to the same embodiment, and such references mean "at least one".

Figure 1:
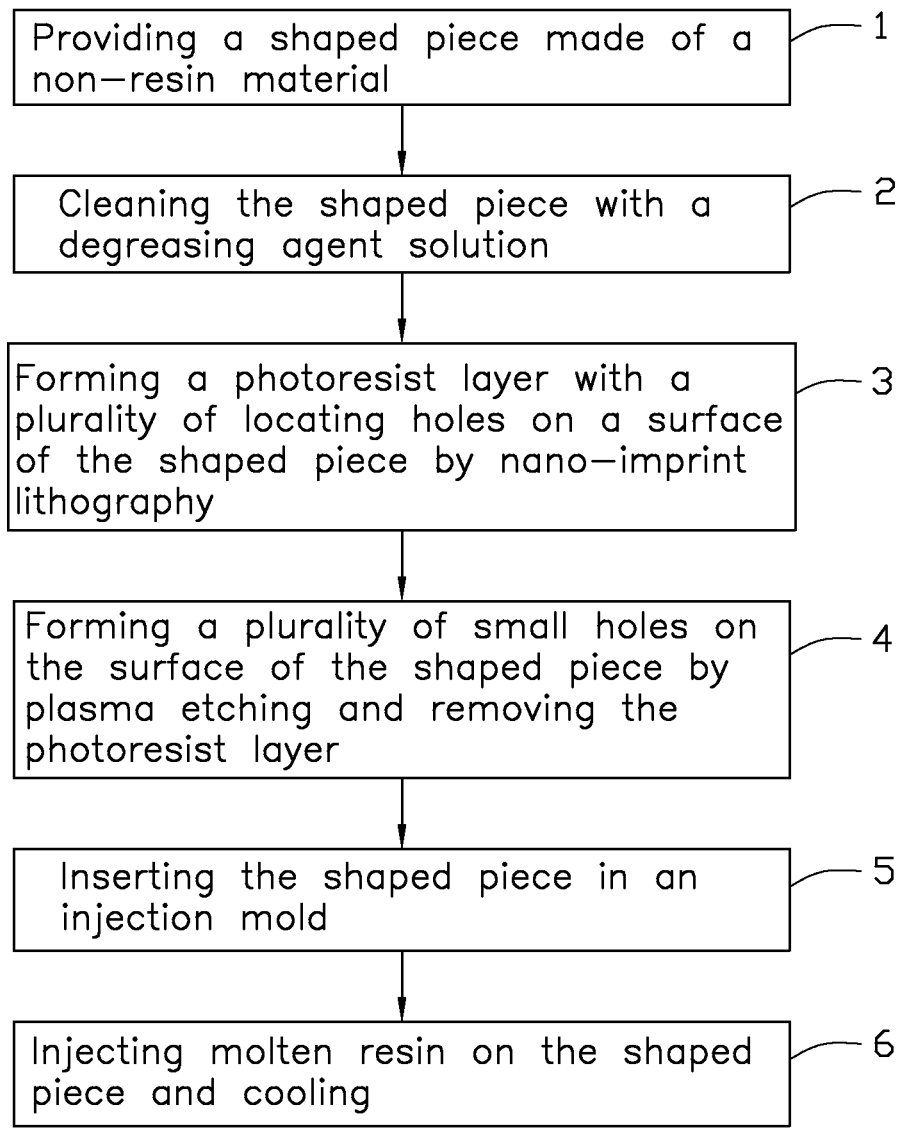
FIG. 1 is a block diagram of an exemplary process for manufacturing a composite of resin and other material.
Figure 2:
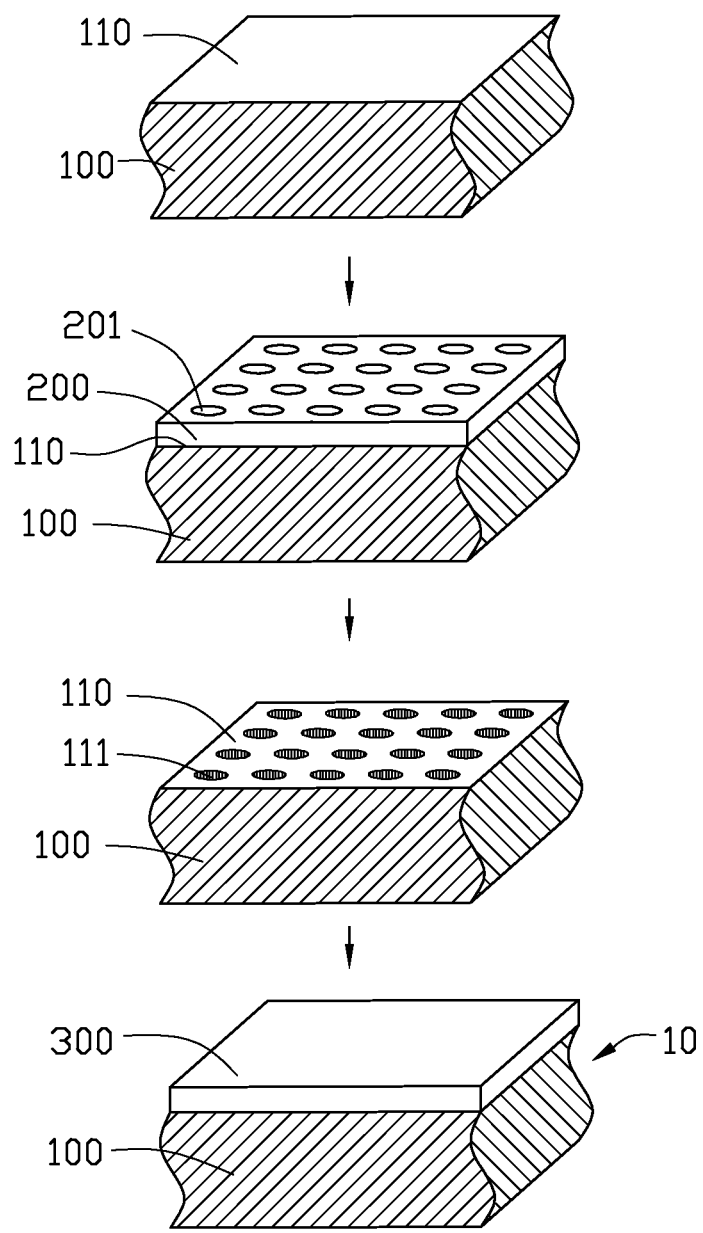
FIG. 2 is a perspective view of the exemplary process for manufacturing the composite of resin and other material.

FIG. 1 and FIG. 2 illustrate a method for manufacturing a composite of resin and other material, which can include following steps.

In block 1, a shaped piece 100 is provided. The shaped piece 100 can be made of a non-resin material, and can be selected from the group consisting of metal, alloy, ceramic, glass, and combinations thereof. In the embodiment, the shaped piece 100 is made of metal. The shaped piece 100 can be formed by any process, such as machining or casting.

In block 2, the shaped piece 100 is cleaned with a degreasing agent solution. The shaped piece 100 is immersed in the solution having a temperature in an approximate range of 20° C. to 30° C. for 1 minute to 6 minutes. The concentration of degreasing agent contained in the solution can be in the approximate range of 90 grams/liter (g/l) to 150 grams/liter (g/l). The shaped piece 100 is washed with distilled water after removal from the solution.

In block 3, a photoresist layer 200 with a plurality of locating holes 201 is formed on a surface 110 of the shaped piece 100 by nano-imprint lithography. First, the resist layer 200 is coated on the surface 110 of the shaped piece 100. The photoresist layer 200 can be a thermally-curable photoresist or a UV curable photoresist. Then, using a mask (not shown) to form a plurality of locating holes 201 on the photoresist layer 200 by nano-imprint lithography. In the embodiment, the locating holes 201 are arranged in an array. The locating holes 201 can be through holes or blind holes in the photoresist layer 200.

In block 4, a plurality of small holes 111 are formed on the surface 110 of the shaped piece 100 by plasma etching, and the photoresist layer 200 can be removed. In detail, the small holes 111 are formed by isotropic plasma etching under ambient pressure. Then, the photoresist layer 200 can be removed by plasma etching. The plasma can be argon gas or other gases. In the embodiment, the small holes 111, which can be formed below the locating holes 201, are arranged in an array, thereby improving the uniformity of the adhesion force between the resin and other material. In the embodiment, a diameter of the small holes 111 can be in a range of about 50 nm to 500 nm, and a breadth depth ratio of the small hole 111 can be in a range of about 1:1 to about 1:10.

In block 5, the shaped piece 100 is inserted into a mold (not shown). The shaped piece 100 can be heated to a temperature in a range of 100° C. to 350° C. The heating can be accomplished using electromagnetic induction.

Figure 3:
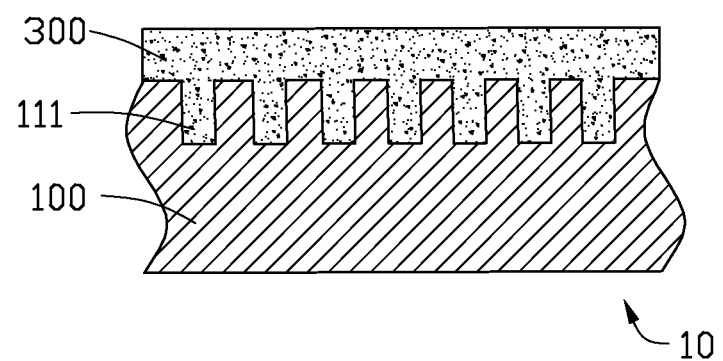
FIG. 3 is a cross-sectional view of the composite of resin and other material as shown in FIG. 2.

In block 6, molten resin piece 300 is injected into the mold and onto the shaped piece 100. FIG. 3 shows the composite of resin and other material 10. The resin piece 300 is crystallized-type thermoplastic resin. The molten resin piece 300 becomes partially embedded in the small holes 111 and bonds with the shaped piece 100 when the resin piece 300 is cooled. The crystallized-type thermoplastic resin material can be selected from the group consisting of a composite of polyphenylene sulfide and glass fiber, polyamide, polyethylene terephthalate, or polybutylene terephthalate. When using the polyphenylene sulfide and glass fiber composite, the percentage composition of the glass fiber is in a range of 20% to 50%.

The method of manufacturing the composite of resin and other material 10 includes the steps of forming locating holes 201 by nano-imprint lithography and forming small holes 111 by plasma etching. When the resin piece 300 is embedded in the small holes 111 on the surface of the shaped piece 100, the combination strength between the resin and other material is increased. The method of manufacturing the composite of resin and other material 10 does not need strong acids or alkalis, so the method is more environmentally friendly. The shaped piece 100 can be made of many kinds of heterogeneous materials. Furthermore, the method can be processed under ambient pressure, and the difficulty of processing is reduced, therefore, the method is more suitable for mass production.

It is believed that the present embodiments and their advantages will be understood from the foregoing description, and it will be apparent that various changes can be made thereto without departing from the spirit and scope of the embodiments or sacrificing all of its material advantages. The embodiments described herein are illustrative and should not be construed as limiting the following claims.

What is claimed is:

1. A method of manufacturing a composite of resin and other materials, comprising:
   providing a shaped piece made of at least one material different than resin;
   cleaning the shaped piece with a degreasing agent solution;
   forming a photoresist layer with a plurality of locating holes on a surface of the shaped piece by nano-imprint lithography, wherein the locating holes are blind holes and remains of the photoresist layer is positioned below the locating holes;

forming a plurality of small holes on the surface of the shaped piece by plasma etching, simultaneously removing the remains of the photoresist layer below the locating holes by plasma etching, and removing the whole photoresist layer;

inserting the shaped piece in an injection mold; and injecting a molten resin material on the shaped piece, the resin material combining with the shaped piece as the resin material cools.

2. The method as claimed in claim 1, wherein the at least one material of the shaped piece is selected from the group consisting of metal, alloy, ceramic, glass, and mixtures thereof.

3. The method as claimed in claim 1, wherein the resin material is a crystallized-type thermoplastic resin.

4. The method as claimed in claim 3, wherein the resin material is selected from the group consisting of a composite of polyphenylene sulfide and glass fiber, polyamide, polyethylene terephthalate, or polybutylene terephthalate.

5. The method as claimed in claim 1, wherein a diameter of the small hole is in a range of about 50 nm to about 500 nm, and a breadth depth ratio of the small hole is in a range of about 1:1 to about 1:10.

6. The method as claimed in claim 1, wherein the small holes are arranged in an array on the surface of the shaped piece.

7. The method as claimed in claim 1, wherein the small holes are formed by isotropic plasma etching under normal pressure.

8. The method as claimed in claim 1, wherein the nano-imprint lithography process comprises the steps of forming a photoresist layer on a surface of the shaped piece and forming a plurality of locating holes on the photoresist layer by nano-imprint lithography.

9. The method as claimed in claim 7, wherein the locating holes are arranged in an array in the photoresist layer.

\* \* \* \* \*